United States Patent
Moon et al.

(10) Patent No.: US 11,950,455 B2
(45) Date of Patent: Apr. 2, 2024

(54) TRANSISTOR SUBSTRATE AND DISPLAY DEVICE COMPRISING SAME

(71) Applicant: Samsung Display Co., Ltd., Yongin-si (KR)

(72) Inventors: Yeonkeon Moon, Hwaseong-si (KR); Joonseok Park, Yongin-si (KR); Kwang-suk Kim, Suwon-si (KR); Myounghwa Kim, Seoul (KR); Taesang Kim, Seoul (KR); Geunchul Park, Suwon-si (KR); Kyungjin Jeon, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 240 days.

(21) Appl. No.: 17/287,936

(22) PCT Filed: Feb. 20, 2019

(86) PCT No.: PCT/KR2019/002030
§ 371 (c)(1),
(2) Date: Apr. 22, 2021

(87) PCT Pub. No.: WO2020/085584
PCT Pub. Date: Apr. 30, 2020

(65) Prior Publication Data
US 2021/0399074 A1    Dec. 23, 2021

(30) Foreign Application Priority Data
Oct. 22, 2018    (KR) .................. 10-2018-0126161

(51) Int. Cl.
*H01L 29/786*    (2006.01)
*H01L 27/12*    (2006.01)
(Continued)

(52) U.S. Cl.
CPC ... *H10K 59/1213* (2023.02); *H01L 29/78618* (2013.01); *H01L 29/7869* (2013.01); *H01L 29/78696* (2013.01); *H10K 59/131* (2023.02)

(58) Field of Classification Search
CPC ............. H01L 27/3262; H01L 27/3276; H01L 29/78618; H01L 29/7869; H01L 29/78696;
(Continued)

(56) References Cited

U.S. PATENT DOCUMENTS 8,728,838 B2    5/2014   Takahara
9,634,038 B2    4/2017   Kwon et al.
(Continued)

FOREIGN PATENT DOCUMENTS

CN    102842509 A    12/2012
CN    103915490 A    7/2014
(Continued)

OTHER PUBLICATIONS

"Determination of the field-effect mobility and the density of states of a Thin-Film Transistor"—J.J. Buendía, M. de Cea, J. Luan Universitat Politècnica de Catalunya · BarcelonaTech (Dated: May 29, 2015).*

(Continued)

*Primary Examiner* — David Vu
(74) *Attorney, Agent, or Firm* — Lewis Roca Rothgerber Christie LLP

(57) ABSTRACT

A transistor substrate may include a substrate including a first region and a second region, a first buffer layer disposed in the first region on the substrate and including silicon nitride, a second buffer layer disposed in the first region and the second region on the first buffer layer and including silicon oxide, a first transistor disposed in the first region on the second buffer layer and including a first oxide semicon-
(Continued)

ductor layer and a first gate electrode overlapping the first oxide semiconductor layer, and a second transistor disposed in the second region on the second buffer layer and including a second oxide semiconductor layer and a second gate electrode overlapping the second oxide semiconductor layer.

23 Claims, 10 Drawing Sheets

(51) Int. Cl.
*H10K 59/121* (2023.01)
*H10K 59/131* (2023.01)

(58) Field of Classification Search
CPC ........... H01L 29/78648; H01L 27/1251; H01L 27/1225; H01L 27/1214; H01L 29/78606; H01L 29/78645; H10K 59/1213; H10K 59/131; H10K 59/12
See application file for complete search history.

(56) References Cited

U.S. PATENT DOCUMENTS

| | | | |
|---|---|---|---|
| 10,109,650 | B2 | 10/2018 | Hiromasu et al. |
| 11,380,795 | B2 | 7/2022 | Yamazaki et al. |
| 2006/0261336 | A1 | 11/2006 | Ohnuma et al. |
| 2011/0049507 | A1 | 3/2011 | Choi |
| 2011/0057181 | A1 | 3/2011 | Choi et al. |
| 2011/0122325 | A1 | 5/2011 | Yamashita et al. |
| 2014/0183522 | A1 | 7/2014 | Cha et al. |
| 2014/0299860 | A1 | 10/2014 | Park et al. |
| 2015/0123084 | A1 | 5/2015 | Kim et al. |
| 2015/0228803 | A1* | 8/2015 | Koezuka .......... H01L 29/78606 257/43 |
| 2016/0379562 | A1* | 12/2016 | Yoon .................... G09G 3/3233 345/215 |
| 2018/0175076 | A1 | 6/2018 | Kim et al. |

FOREIGN PATENT DOCUMENTS

| | | | | | |
|---|---|---|---|---|---|
| JP | 2009-224595 | A | | 10/2009 | |
| JP | 2011-112724 | A | | 6/2011 | |
| JP | 2015-144250 | A | | 8/2015 | |
| JP | 2017-188505 | A | | 10/2017 | |
| KR | 10-2011-0025549 | A | | 3/2011 | |
| KR | 10-1073542 | B1 | | 10/2011 | |
| KR | 10-1256446 | B1 | | 4/2013 | |
| KR | 10-1421288 | B2 | | 7/2014 | |
| KR | 10-2014-0117229 | A | | 10/2014 | |
| KR | 10-2014-0131137 | A | | 11/2014 | |
| KR | 10-2015-0051824 | A | | 5/2015 | |
| KR | 20160043327 | A | * | 4/2016 | .......... H01L 27/1222 |
| KR | 10-2018-0069974 | A | | 6/2018 | |
| KR | 10-2018-0079082 | A | | 7/2018 | |

OTHER PUBLICATIONS

Noh, Ji Yong et al.; "Development of 55" 4K UHD OLED TV employing the internal gate IC with high reliability and short channel IGZO TFTs"; Journal of the SID; 26/1; 2018; pp. 36-41.

* cited by examiner

TRANSISTOR SUBSTRATE AND DISPLAY DEVICE COMPRISING SAME

CROSS-REFERENCE TO RELATED APPLICATIONS

This application is a U.S. National Phase Patent Application of International Application Number PCT/KR2019/002030, filed on Feb. 20, 2019, which claims priority to Korean Patent Application Number 10-2018-0126161, filed on Oct. 22, 2018, the entire contents of all of which are incorporated herein by reference.

TECHNICAL FIELD

Embodiments herein relate to an electronic device. More particularly, embodiments relate to a transistor substrate and a display device including the same.

BACKGROUND ART

A transistor is used for various electronic devices such as display devices. For example, the transistor is used as an element constituting a pixel circuit and a driving circuit in a display device such as a liquid crystal display device and an organic light emitting display device.

A transistor may include a gate electrode, a source electrode, a drain electrode, and a semiconductor layer electrically connected to the source electrode and the drain electrode. The semiconductor layer is an important factor that determines properties of the transistor.

The semiconductor layer may include silicon (Si). The silicon may be classified into amorphous silicon and polycrystalline silicon according to a crystalline form. While amorphous silicon has a simple manufacturing process, there is a limit to manufacturing a high-performance transistor due to the low charge mobility. While polycrystalline silicon has high charge mobility, a silicon crystallization step is required, so the manufacturing cost is high and the process is complicated.

Researches on transistors using oxide semiconductors, which have a higher charge mobility and a higher on/off rate compared to amorphous silicon, and have an inexpensive cost and a higher uniformity compared to polycrystalline silicon, have been conducted so as to complement amorphous silicon and polycrystalline silicon. However, the oxide semiconductor may be affected by hydrogen introduced from other adjacent insulating layers.

DISCLOSURE

Technical Problem

An aspect of the present disclosure is to provide a transistor substrate with a high resolution and a display device including the same.

Technical Solution

In order to achieve aspects of the present disclosure described above, a transistor substrate may include a substrate including a first region and a second region, a first buffer layer disposed in the first region on the substrate and including silicon nitride, a second buffer layer disposed in the first region and the second region on the first buffer layer and including silicon oxide, a first transistor disposed in the first region on the second buffer layer and including a first oxide semiconductor layer and a first gate electrode overlapping the first oxide semiconductor layer, and a second transistor disposed in the second region on the second buffer layer and including a second oxide semiconductor layer and a second gate electrode overlapping the second oxide semiconductor layer.

In some embodiments, the second buffer layer may have a flat top surface in the first region and the second region.

In some embodiments, the first oxide semiconductor layer may include a first source region, a first drain region, and a first channel region positioned therebetween, and the second oxide semiconductor layer may include a second source region, a second drain region, and a second channel region positioned therebetween.

In some embodiments, the second channel region may have a length shorter than a length of the first channel region.

In some embodiments, the length of the second channel region may be 1.5 µm to 4.0 µm.

In some embodiments, the transistor substrate may further include an interlayer insulating layer disposed on the first gate electrode and the second gate electrode. The first transistor may further include a first source electrode and a first drain electrode disposed on the interlayer insulating layer and connected to the first source region and the first drain region, respectively, and the second transistor may further include a second source electrode and a second drain electrode disposed on the interlayer insulating layer, and connected to the second source region and the second drain region, respectively.

In some embodiments, the first oxide semiconductor layer may have charge mobility greater than a charge mobility of the second oxide semiconductor layer.

In some embodiments, the transistor substrate may further include a first gate insulating layer disposed between the first oxide semiconductor layer and the first gate electrode and a second gate insulating layer disposed between the second oxide semiconductor layer and the second gate electrode.

In some embodiments, each of the first transistor and the second transistor may include an n-channel transistor.

In some embodiments, the transistor substrate may further include a metal layer disposed between the substrate and the first buffer layer and overlapping the first oxide semiconductor layer.

In some embodiments, the metal layer may be connected to the first gate electrode.

In some embodiments, the transistor substrate may further include a third transistor disposed in the first region on the second buffer layer, spaced apart from the first transistor, and including a third oxide semiconductor layer and a third gate electrode overlapping the third oxide semiconductor layer, and a metal layer disposed between the substrate and the first buffer layer and overlapping the third oxide semiconductor layer.

In some embodiments, the third oxide semiconductor layer may have a charge mobility greater than a charge mobility of the first oxide semiconductor layer.

In some embodiments, the metal layer may be connected to the third gate electrode.

In some embodiments, the transistor substrate may further include a third transistor disposed in the second region on the second buffer layer, spaced apart from the second transistor, and including a third oxide semiconductor layer and a third gate electrode overlapping the third oxide semiconductor layer.

In some embodiments, a length of a channel region of the third oxide semiconductor layer maybe longer than a length of a channel region of the second oxide semiconductor layer.

In some embodiments, a length of a channel region of the third oxide semiconductor layer may be 4.0 μm or more.

In some embodiments, a driving range of the third transistor may be greater than a driving range of the second transistor.

In order to achieve aspects of the present disclosure described above, a transistor substrate may include a substrate including a first region and a second region, a buffer layer disposed in the first region and the second region on the substrate, a first transistor disposed in the first region on the buffer layer and including a first oxide semiconductor layer and a first gate electrode overlapping the first oxide semiconductor layer, and a second transistor disposed in the second region on the buffer layer and including a second oxide semiconductor layer and a second gate electrode overlapping the second oxide semiconductor layer. The buffer layer disposed in the first region may have a hydrogen concentration higher than a hydrogen concentration of the buffer layer disposed in the second region.

In some embodiments, the buffer layer may include a first buffer layer disposed in the first region on the substrate and including silicon nitride, and a second buffer layer disposed in the first region and the second region on the first buffer layer and including silicon oxide.

In order to achieve aspects of the present disclosure described above, a display device may include a substrate including a driving portion and a pixel portion, a first buffer layer disposed in the driving portion on the substrate and including silicon nitride, a second buffer layer disposed in the driving portion and the pixel portion on the first buffer layer and including silicon oxide, a first transistor disposed in the driving portion on the second buffer layer and including a first oxide semiconductor layer and a first gate electrode overlapping the first oxide semiconductor layer, a second transistor disposed in the pixel portion on the second buffer layer and including a second oxide semiconductor layer and a second gate electrode overlapping the second oxide semiconductor layer, a first electrode disposed in the pixel portion on the substrate, a second electrode facing the first electrode, and a light emitting layer disposed between the first electrode and the second electrode.

In some embodiments, the display device may further include a third transistor disposed in the pixel portion on the second buffer layer, spaced apart from the second transistor, and including a third oxide semiconductor layer and a third gate electrode overlapping the third oxide semiconductor layer. A length of a channel region of the third oxide semiconductor layer may be longer than a length of a channel region of the second oxide semiconductor layer.

In some embodiments, the display device may further include a scan line and a data line intersecting the scan line. The second transistor may be connected to the scan line and the data line, and the third transistor may be connected to a display element.

In some embodiments, the channel region of the second oxide semiconductor layer may have a length of 1.5 μm to 4.0 μm, and the channel region of the third oxide semiconductor layer may have a length of 4.0 μm or more.

Advantageous Effects

In the transistor substrate according to some embodiments, the first buffer layer including silicon nitride and the second buffer layer including silicon oxide may be disposed under the first transistor, and only the second buffer layer including silicon oxide may be disposed under the second transistor. Therefore, charge mobility of the first oxide semiconductor layer of the first transistor may increase due to hydrogen supplied from the first buffer layer. Further, since hydrogen is not supplied to the second transistor, the second transistor including the second oxide semiconductor layer having a short channel region may be formed.

In the display device according to some embodiments, materials of the buffer layer formed in the driving portion and the pixel portion may be different from each other, so that charge mobility of the first transistor disposed in the driving portion may increase, and a length of a channel region of the second transistor disposed in the pixel portion may decrease. Accordingly, the number or the first transistors disposed in the driving portion may decrease thereby reducing an area of the driving portion. Further, the number of the second transistors disposed in the pixel portion may increase thereby realizing the display device with a high resolution.

BEST MODE

Mode for Invention

Hereinafter, transistor substrates and display devices in accordance with embodiments of the present disclosure will be explained in detail with reference to the accompanying drawings.

Hereinafter, a transistor substrate according to some embodiments of the present disclosure will be described with reference to FIG. 1.

Figure 1:
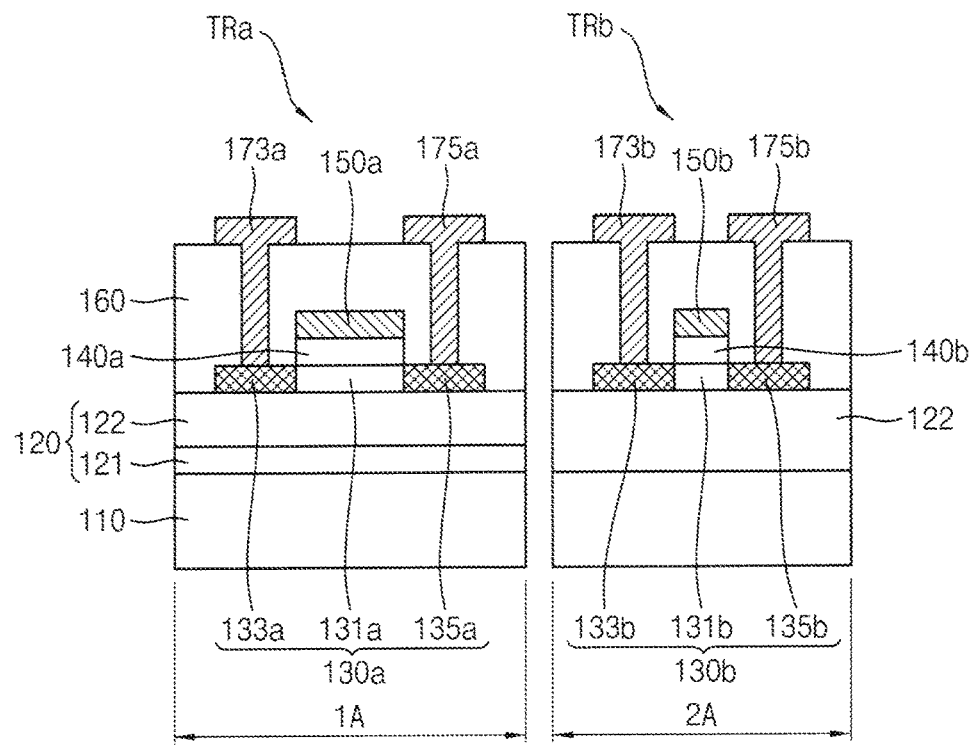
FIG. 1 is a sectional view showing a transistor substrate according to some embodiments of the present disclosure.

FIG. 1 is a sectional view showing the transistor substrate according to some embodiments of the present disclosure.

Referring to FIG. 1, the transistor substrate according to some embodiments may include a substrate 110, a buffer layer 120, a first transistor TRa, and a second transistor TRb.

The substrate 110 may be an insulating substrate including glass, quartz, ceramic, plastic, and the like. The substrate 110 may include a first region 1A and a second region 2A.

The buffer layer 120 may be disposed on the substrate 110. The buffer layer 120 may prevent impurities such as oxygen and moisture from permeating through the substrate 110. The buffer layer 120 may provide a flat surface on the substrate 110. The buffer layer 120 may include a first buffer layer 121 and a second buffer layer 122.

The first buffer layer 121 may be disposed in the first region 1A on the substrate 110. The first buffer layer 121 might not be disposed in the second region 2A. The first buffer layer 121 may include silicon nitride (SiNx). The silicon nitride (SiNx) may contain a relatively large amount of hydrogen. Accordingly, a hydrogen concentration of the first buffer layer 121 may be relatively high.

The second buffer layer 122 may be disposed in the first region 1A and the second region 2A on the first buffer layer 121. The second buffer layer 122 may be disposed on the substrate 110 to cover the first buffer layer 121. For example, the first buffer layer 121 and the second buffer layer 122 may be disposed in the first region 1A on the substrate 110, and the second buffer layer 122 may be disposed in the second region 2A on the substrate 110. The second buffer layer 122 may include silicon oxide (SiOx). The silicon oxide (SiOx) may contain relatively less hydrogen. Accordingly, a hydrogen concentration of the second buffer layer 122 may be relatively low. The second buffer layer 122 may have a flat top surface in the first region 1A and the second region 2A. Accordingly, the buffer layer 120 may provide a flat surface onto the first transistor TRa and the second transistor TRb.

The buffer layer 120 disposed in the first region 1A may include a first buffer layer 121 including silicon nitride SiNx containing a relatively large amount of hydrogen, and a second buffer layer 122 including silicon oxide SiOx, and the buffer layer 120 disposed in the second region 2A may include only a second buffer layer 122 including silicon oxide (SiOx) containing a relatively small amount of hydrogen. Accordingly, the hydrogen concentration of the buffer layer 120 disposed in the first region 1A may be greater than the hydrogen concentration of the buffer layer 120 disposed in the second region 2A.

The first transistor TRa may be disposed in the first region 1A on the buffer layer 120, and the second transistor TRb may be disposed in the second region 2A on the buffer layer 120. The first transistor TRa may include a first oxide semiconductor layer 130a, a first gate electrode 150a, a first source electrode 173a, and a first drain electrode 175a. The second transistor TRb may include a second oxide semiconductor layer 130b, a second gate electrode 150b, a second source electrode 173b, and a second drain electrode 175b.

In some embodiments, each of the first transistor TRa and the second transistor TRb may be an n-channel transistor. However, the present disclosure is not limited thereto. In other embodiments, each of the first transistor TRa and the second transistor TRb may be a p-channel transistor.

The first oxide semiconductor layer 130a may be disposed in the first region 1A on the second buffer layer 122, and the second oxide semiconductor layer 130b may be disposed in the second region 2A on the second buffer layer 122. The first oxide semiconductor layer 130a may include a first source region 133a, a first drain region 135a, and a first channel region 131a positioned therebetween. The second oxide semiconductor layer 130b may include a second source region 133b, a second drain region 135b, and a second channel region 131b positioned therebetween.

The first oxide semiconductor layer 130a and the second oxide semiconductor layer 130b may include oxide of metal such as zinc (Zn), indium (In), gallium (Ga), tin (Sn), and titanium (Ti), or a combination of metal such as zinc (Zn), indium (In), gallium (Ga), tin (Sn), and titanium (Ti), and oxide thereof. For example, the metal oxide may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

Figure 2:
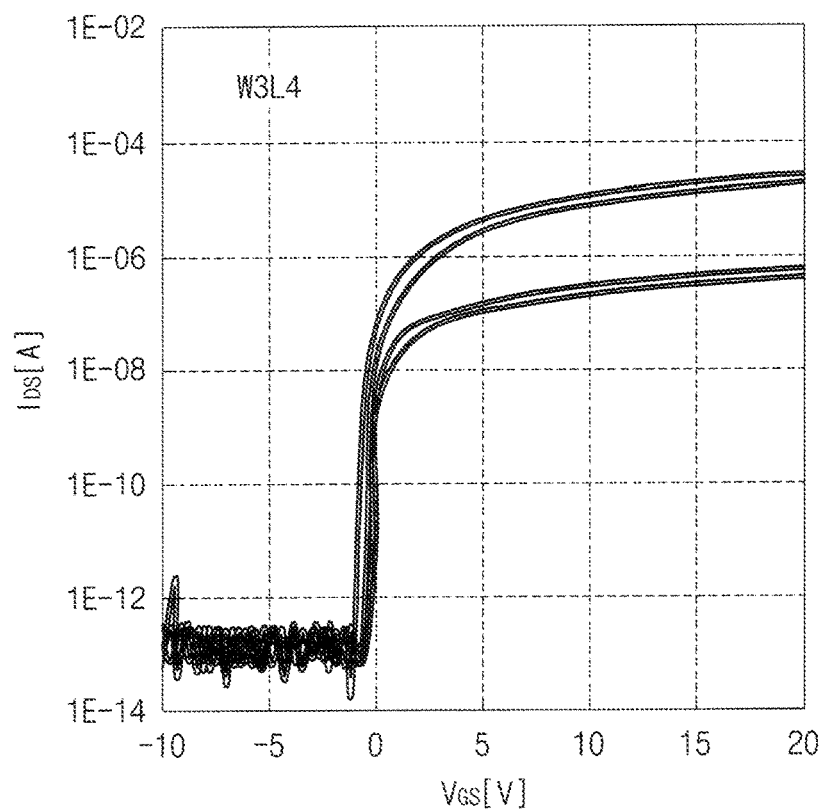
FIG. 2 is a graph showing a voltage-current relation of a first transistor of the transistor substrate in FIG. 1.
Figure 3:
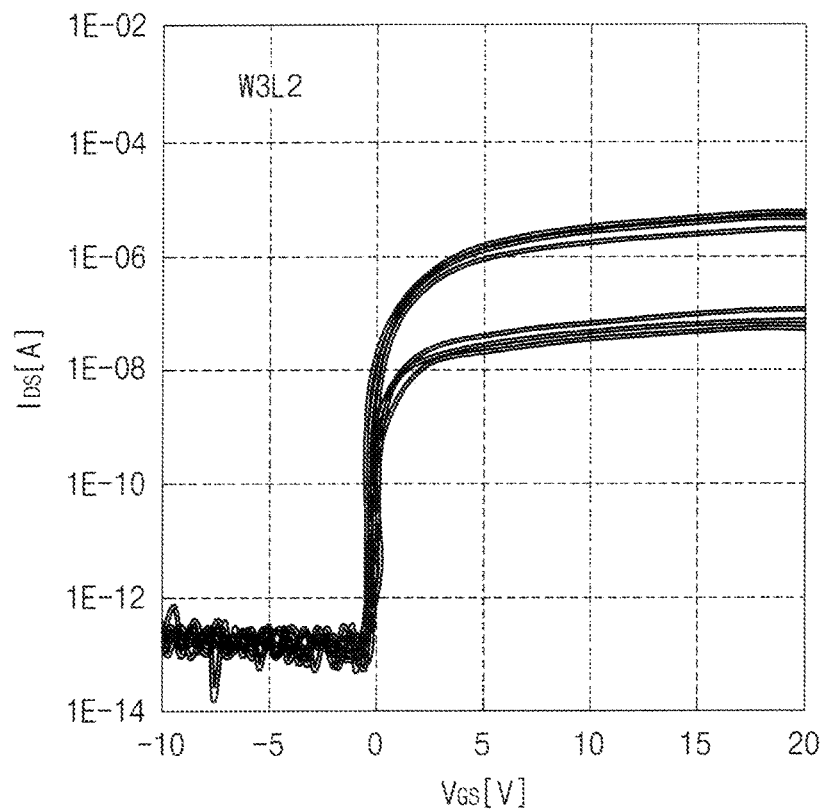
FIG. 3 is a graph showing a voltage-current relation of a second transistor of the transistor substrate in FIG. 1.

FIG. 2 is a graph showing a voltage-current relation of the first transistor TRa of the transistor substrate in FIG. 1. FIG. 3 is a graph showing a voltage-current relation of the second transistor TRb of the transistor substrate in FIG. 1.

Referring to FIGS. 2 and 3, a charge mobility of the first oxide semiconductor layer 130a of the first transistor TRa may be greater than a charge mobility of the second oxide semiconductor layer 130b of the second transistor TRb. In some embodiments, the charge mobility of the first oxide semiconductor layer 130a may be about 11.9 cm2/V·sec, and the charge mobility of the second oxide semiconductor layer 130b may be about 3.0 cm2/V·sec.

The first buffer layer 121 may be positioned between the first oxide semiconductor layer 130a and the substrate 110 that are positioned in the first region 1A. A first buffer layer 121 including silicon nitride (SiNx) as well as a second buffer layer 122 including silicon oxide (SiOx) may be positioned under the first oxide semiconductor layer 130a.

When hydrogen is introduced into the oxide semiconductor layer from the insulating layer, an amount of hydrogen serving as a carrier in the oxide semiconductor layer increases, and accordingly, the charge mobility of the oxide semiconductor layer may increase. Since the first buffer layer 121 including silicon nitride (SiNx) contains a relatively large amount of hydrogen, hydrogen in the first buffer layer 121 diffuses upward, so that a sufficient amount of hydrogen may be introduced into the first oxide semiconductor layer 130a. Accordingly, the charge mobility of the first oxide semiconductor layer 130a may be greater than the charge mobility of the second oxide semiconductor layer 130b.

A length of the second channel region 131b may be shorter than a length of the first channel region 131a. In some embodiments, the length of the first channel region 131a may be greater than or equal to about 4.0 µm, and the length of the second channel region 131b may be about 1.5 µm to about 4.0 µm. For example, the length of the first channel region 131a may be about 4.0 µm, and the length of the second channel region 131b may be about 2.0 µm.

Only the second buffer layer 122 may be positioned between the second oxide semiconductor layer 130b and the substrate 110 that are positioned in the second region 2A. Under the second oxide semiconductor layer 130b, the second buffer layer 122 including silicon oxide (SiOx) may be positioned, and the first buffer layer 121 including silicon nitride SiNx might not be positioned.

When hydrogen is introduced into the oxide semiconductor layer from the insulating layer, the oxide semiconductor layer may become conductive, so that a length of an effective channel region of the oxide semiconductor layer may decrease. Since the second buffer layer 122 including silicon oxide (SiOx) contains a relatively small amount of hydrogen, the introduction of hydrogen into the second oxide semiconductor layer 130b may be minimized. Accordingly, even when the first channel region 131a has a relatively short length, the length of an effective channel region having a predetermined size or more may be maintained.

The first gate insulating layer 140a may be disposed on the first oxide semiconductor layer 130a, and the second gate insulating layer 140b may be disposed on the second oxide semiconductor layer 130b. The first gate insulating layer 140a may overlap the first channel region 131a, and the second gate insulating layer 140b may overlap the second channel region 131b. The first gate insulating layer 140a and the second gate insulating layer 140b may include an insulating material such as silicon oxide (SiOx) and silicon nitride (SiNx). The first gate insulating layer 140a and the second gate insulating layer 140b may be formed of the same material in the same manufacturing step. Since the first gate insulating layer 140a does not cover the first source region 133a and the first drain region 135a, and the second gate insulating layer 140b does not cover the second source region 133b and the second drain region 135b, the interlayer insulating layer 160 may come into direct contact with the first source region 133a, the first drain region 135a, the second source region 133b, and the second drain region 135b. Accordingly, since hydrogen diffuses from the interlayer insulating layer 160 adjacent to the first source region 133a, the first drain region 135a, the second source region 133b, and the second drain region 135b, the first source region 133a, the first drain region 135a, the second source region 133b, and the second drain region 135b may become conductive.

The first gate electrode 150a may be disposed on the first gate insulating layer 140a, and the second gate electrode 150b may be disposed on the second gate insulating layer 140b. The first gate electrode 150a may overlap the first oxide semiconductor layer 130a, and the second gate electrode 150b may overlap the second oxide semiconductor layer 130b. Specifically, the first gate electrode 150a may overlap the first channel region 131a, and the second gate electrode 150b may overlap the second channel region 131b. The first gate electrode 150a and the second gate electrode 150b may include at least one of copper (Cu), copper alloy, aluminum (Al), aluminum alloy, molybdenum (Mo), and molybdenum alloy. The first gate electrode 150a and the second gate electrode 150b may be formed of the same material in the same manufacturing step.

An interlayer insulating layer 160 may be disposed on the first gate electrode 150a and the second gate electrode 150b. The interlayer insulating layer 160 may be disposed in the first region 1A and the second region 2A on the second buffer layer 122 to cover the first oxide semiconductor layer 130a, the second oxide semiconductor layer 130b, the first gate electrode 150a, and the second gate electrode 150b.

A first source electrode 173a and a first drain electrode 175a connected to the first source region 133a and the first drain region 135a, respectively, may be disposed in the first region 1A on the interlayer insulating layer 160, and a second source electrode 173b and a second drain electrode 175b connected to the second source region 133b and the second drain region 135b, respectively, may be disposed in the second region 2A on the interlayer insulating layer 160. The first source electrode 173a, the first drain electrode 175a, the second source electrode 173b, and the second drain electrode 175b may come into contact with the first source region 133a, the first drain region 135a, the second source region 133b, and the second drain region 135b through contact holes formed in the interlayer insulating layer 160, respectively. The first source electrode 173a, the first drain electrode 175a, the second source electrode 173b, and the second drain electrode 175b may include at least one of copper (Cu), copper alloy, aluminum (Al), aluminum alloy, molybdenum (Mo), and molybdenum alloy. The first source electrode 173a, the first drain electrode 175a, the second source electrode 173b, and the second drain electrode 175b may be formed of the same material in the same manufacturing step.

In the transistor substrate according to some embodiments of the present disclosure, as the first buffer layer 121 including silicon nitride (SiNx) and the second buffer layer 122 including silicon oxide (SiOx) are disposed under the first transistor TRa, the first oxide semiconductor layer 130a of the first transistor TRa may have a relatively greater charge mobility. Accordingly, the number of the first transistors TRa disposed in the first region 1A may decrease, and an area of the first region 1A may decrease.

In addition, in the transistor substrate according to some embodiments of the present disclosure, as only the second buffer layer 122 including silicon oxide (SiOx) is disposed under the second transistor TRb, the second oxide semiconductor layer 130b of the second transistor TRb may include a second channel region 131b having a relatively short length. Accordingly, an area of the second transistor TRb disposed in the second region 2A may decrease, and the number of the second transistors TRb disposed in the second region 2A may increase.

Hereinafter, a transistor substrate according to other embodiments of the present disclosure will be described with reference to FIG. 4.

Figure 4:
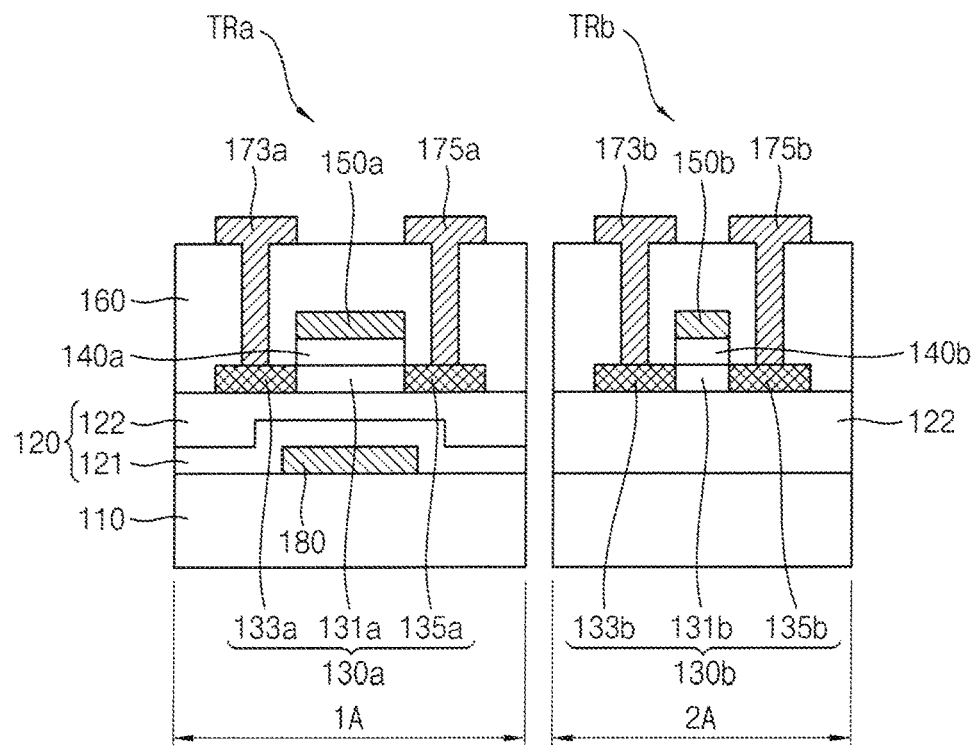
FIG. 4 is a sectional view showing a transistor substrate according to other embodiments of the present disclosure.

FIG. 4 is a sectional view showing the transistor substrate according to other embodiments of the present disclosure.

Since the transistor substrate according to other embodiments described with reference to FIG. 4 is substantially the same as the transistor substrate according to some embodiments described with reference to FIG. 1, except for adding the metal layer, descriptions for the substantially same or similar configurations will be omitted.

Referring to FIG. 4, the transistor substrate according to other embodiments may further include a metal layer 180.

The metal layer 180 may be disposed in the first region 1A between the substrate 110 and the first buffer layer 121. The metal layer 180 may overlap the first oxide semiconductor layer 130a. Specifically, the metal layer 180 may overlap the first channel region 131a. The metal layer 180 may include at least one of copper (Cu), copper alloy, aluminum (Al), aluminum alloy, molybdenum (Mo), and molybdenum alloy.

The metal layer 180 may be connected to the first gate electrode 150a. For example, the metal layer 180 may come into contact with the first gate electrode 150a through a contact hole formed through the buffer layer 120.

The metal layer 180 may serve as the gate electrode of the first transistor TRa. In this case, the first transistor TRa may be a double gate type transistor that has the metal layer 180 as a lower gate electrode, and has the first gate electrode 150a as an upper gate electrode.

A current flow path may be formed at a part of the oxide semiconductor layer adjacent to the gate electrode. In the first transistor TRa, since an upper portion of the first channel region 131a adjacent to the first gate electrode 150a and a lower portion of the first channel region 131a adjacent to the metal layer 180 are used as a current flow path, a current flow path may be expanded, and the charge mobility of the first oxide semiconductor layer 130a may increase. In some embodiments, the charge mobility of the first oxide semiconductor layer 130a may be about 19.8 cm2/V·sec.

In the transistor substrate according to other embodiments of the present disclosure, as an electrode layer 180 connected to the first gate electrode 150a is disposed under the first transistor TRa, the first oxide semiconductor layer 130a of the first transistor TRa may have a relatively greater charge mobility. Accordingly, the number of the first transistors TRa disposed in the first region 1A may decrease, and an area of the first region 1A may decrease.

Hereinafter, a transistor substrate according to other embodiments of the present disclosure will be described with reference to FIG. 5.

Figure 5:
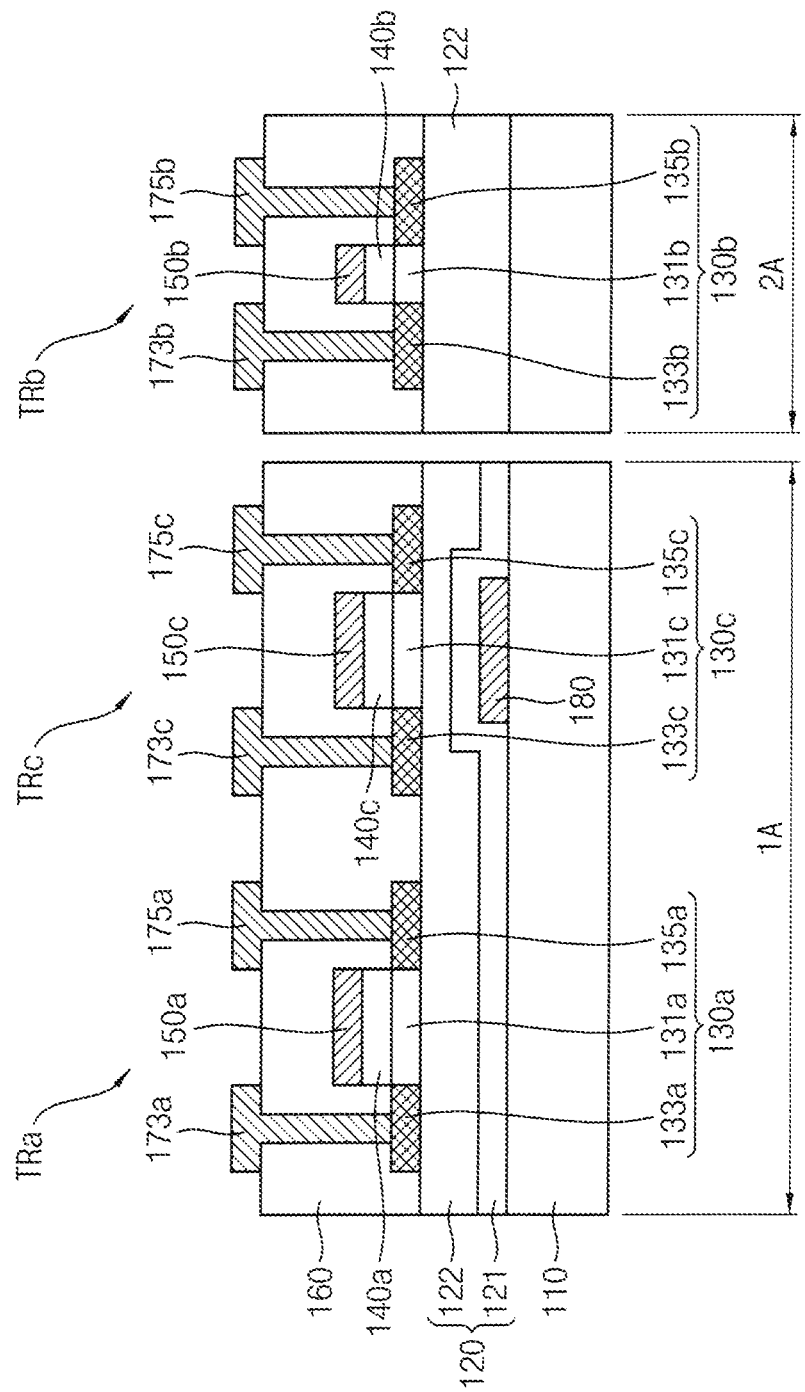
FIG. 5 is a sectional view showing a transistor substrate according to other embodiments of the present disclosure.

FIG. 5 is a sectional view showing the transistor substrate according to other embodiments of the present disclosure.

Since the transistor substrate according to other embodiments described with reference to FIG. 5 is substantially the same as the transistor substrate according to some embodiments described with reference to FIG. 1, except for adding the metal layer and the third transistor, descriptions for the substantially same or similar configurations will be omitted.

Referring to FIG. 5, the transistor substrate according to other embodiments may further include a metal layer 180 and a third transistor TRc.

The metal layer 180 may be disposed in the first region 1A between the substrate 110 and the first buffer layer 121. The metal layer 180 may include at least one of copper (Cu), copper alloy, aluminum (Al), aluminum alloy, molybdenum (Mo), and molybdenum alloy. The metal layer 180 may serve as a gate electrode of the third transistor TRc.

The third transistor TRc may be disposed in the first region 1A on the buffer layer 120. The third transistor TRc may be spaced apart from the first transistor TRa. The third transistor TRc may include a third oxide semiconductor layer 130c, a third gate electrode 150c, a third source electrode 173c, and a third drain electrode 175c.

In some embodiments, the third transistor TRc may be an n-channel transistor. However, the present disclosure is not limited thereto. In other embodiments, the third transistor TRc may be a p-channel transistor.

The third oxide semiconductor layer 130c may be disposed in the first region 1A on the second buffer layer 122. The third oxide semiconductor layer 130c may be spaced apart from the first oxide semiconductor layer 130a. The third oxide semiconductor layer 130c may overlap the metal layer 180. The third oxide semiconductor layer 130c may include a third source region 133c, a third drain region 135c, and a third channel region 131c positioned therebetween. Specifically, the third channel region 131c may overlap the metal layer 180.

The third oxide semiconductor layer 130c may include oxide of metal such as zinc (Zn), indium (In), gallium (Ga), tin (Sn), and titanium (Ti), or a combination of metal such as zinc (Zn), indium (In), gallium (Ga), tin (Sn), and titanium (Ti), and oxide thereof.

A length of the third channel region 131c may be substantially the same as a length of the first channel region 131a. In some embodiments, the length of the third channel region 131c may be greater than or equal to about 4.0 μm. For example, the length of the third channel region 131c may be about 4.0 μm.

A third gate insulating layer 140c may be disposed on the third oxide semiconductor layer 130c. The third gate insulating layer 140c may overlap the third channel region 131c. The third gate insulating layer 140c may include an insulating material such as silicon oxide (SiOx) and silicon nitride (SiNx). The third gate insulating layer 140c may be formed of the same material as the first gate insulating layer 140a and the second gate insulating layer 140b in the same manufacturing step. Since the third gate insulating layer 140c does not cover the third source region 133c and the third drain region 135c, the interlayer insulating layer 160 may come into direct contact with the third source region 133c and the third drain region 135c. Accordingly, since hydrogen diffuses from the interlayer insulating layer 160 adjacent to the third source region 133c and the third drain region 135c, the third source region 133c and the third drain region 135c may become conductive.

The third gate electrode 150c may be disposed on the third gate insulating layer 140c. The third gate electrode 150c may overlap the third oxide semiconductor layer 130c. Specifically, the third gate electrode 150c may overlap the third channel region 131c. The third gate electrode 150c may include at least one of copper (Cu), copper alloy, aluminum (Al), aluminum alloy, molybdenum (Mo), and molybdenum alloy. The third gate electrode 150c may be formed of the same material as the first gate electrode 150a and the second gate electrode 150b in the same manufacturing step.

The third gate electrode 150c may be connected to the metal layer 180. For example, the third gate electrode 150c may come into contact with the metal layer 180 through a contact hole formed through the buffer layer 120. In this case, the third transistor TRc may be a double gate type transistor that has the metal layer 180 as a lower gate electrode, and has the third gate electrode 150c as an upper gate electrode.

Figure 6:
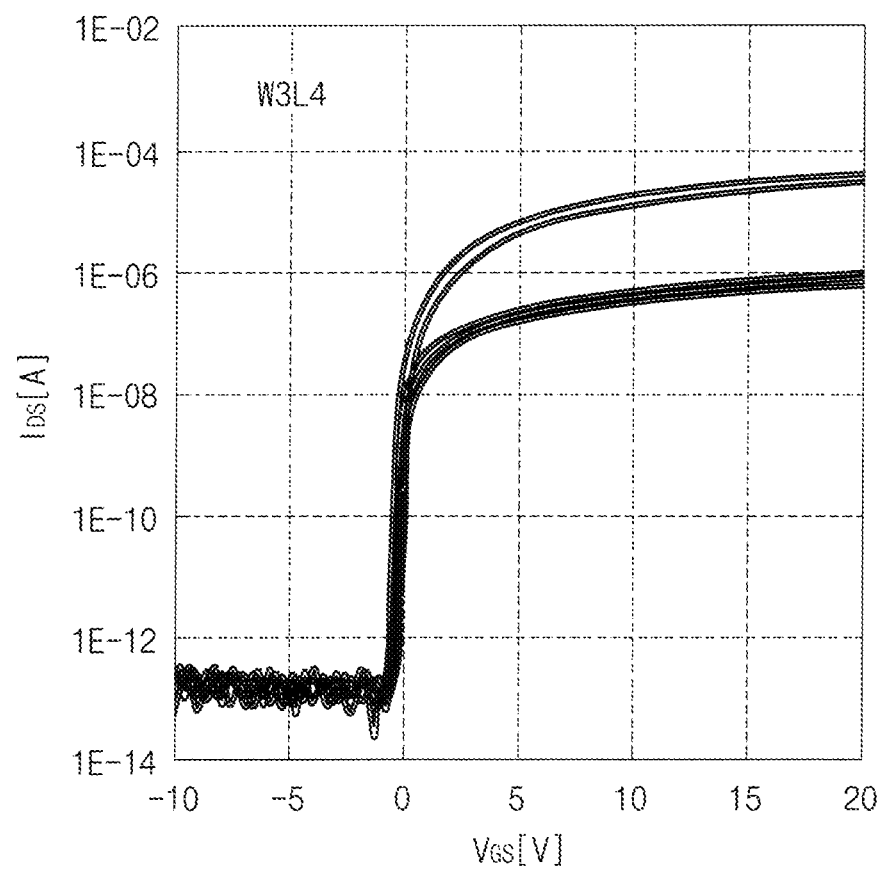
FIG. 6 is a graph showing a voltage-current relation of a third transistor of the transistor substrate in FIG. 5.

FIG. 6 is a graph showing a voltage-current relation of the third transistor TRc of the transistor substrate in FIG. 5.

Referring to FIGS. 2 and 6, a charge mobility of the third oxide semiconductor layer 130c of the third transistor TRc may be greater than a charge mobility of the first oxide semiconductor layer 130a of the first transistor TRa. In some embodiments, the charge mobility of the first oxide semiconductor layer 130a may be about 11.9 cm2/V·sec, and the charge mobility of the third oxide semiconductor layer 130c may be about 19.8 cm2/V·sec.

Whereas the metal layer 180 may be positioned at a lower portion of the third transistor TRc, the metal layer 180 might not be positioned at a lower portion of the first transistor TRa, In the first transistor TRa, an upper portion of the first channel region 131a adjacent to the first gate electrode 150a may be used as a current flow path. In the third transistor TRc, a lower portion of the third channel region 131c adjacent to the third gate electrode 150c and a lower portion of the third channel region 131c adjacent to the metal layer 180 are used as a current flow path. Accordingly, the charge mobility of the third oxide semiconductor layer 130c may be greater than the charge mobility of the first oxide semiconductor layer 130a.

A third source electrode 173c and a third drain electrode 175c connected to the third source region 133c and the third drain region 135c, respectively, may be disposed in the first region 1A on the interlayer insulating layer 160. The third source electrode 173c and the third drain electrode 175c may come into contact with the third source region 133c and the third drain region 135c through contact holes formed in the interlayer insulating layer 160, respectively. The third source electrode 173c and the third drain electrode 175c may include at least one of copper (Cu), copper alloy, aluminum (Al), aluminum alloy, molybdenum (Mo), and molybdenum alloy. The third source electrode 173c and the third drain electrode 175c may be formed of the same material as the first source electrode 173a, the first drain electrode 175a, the second source electrode 173b, and the second drain electrode 175b in the same manufacturing step.

Hereinafter, a transistor substrate according to other embodiments of the present disclosure will be described with reference to FIG. 7.

Figure 7:
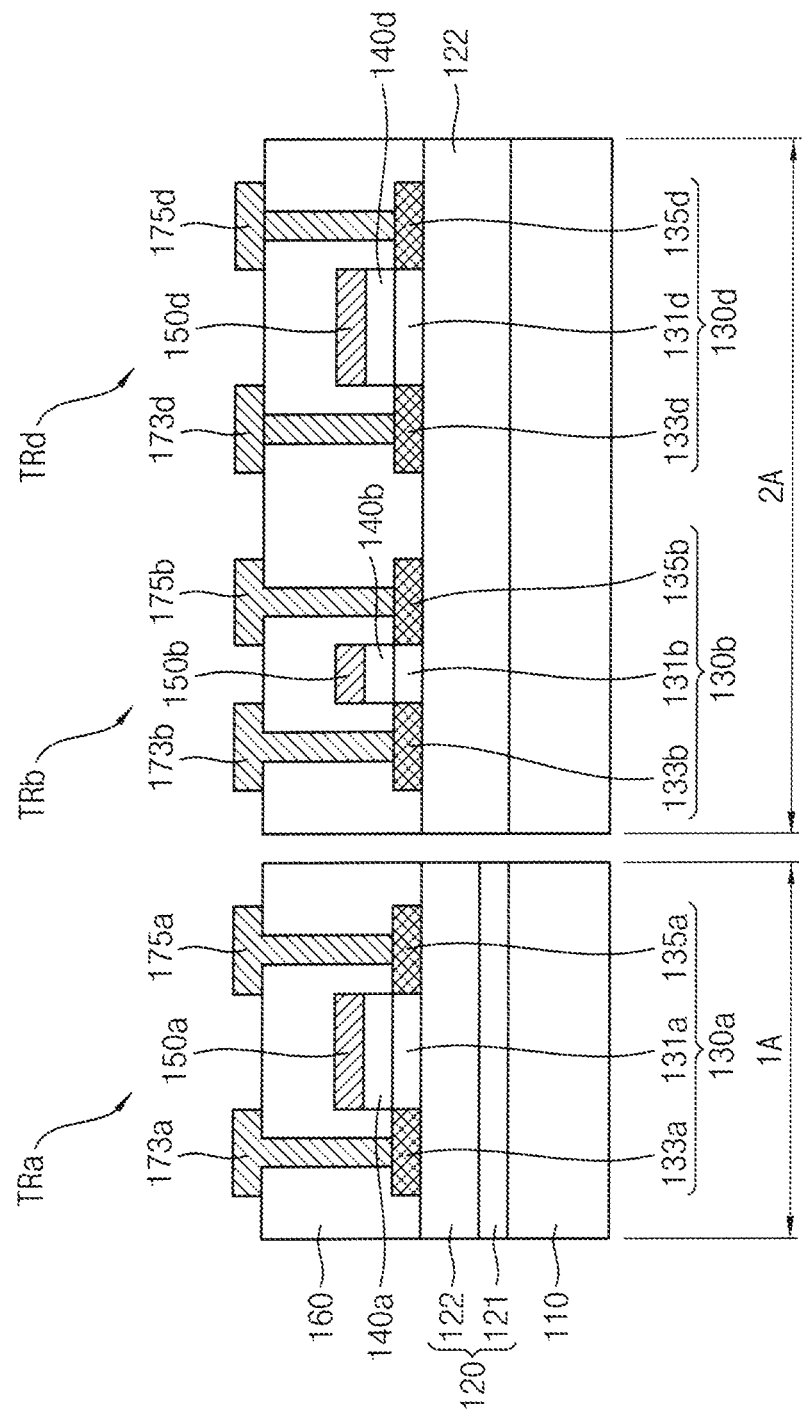
FIG. 7 is a sectional view showing a transistor substrate according to other embodiments of the present disclosure.

FIG. 7 is a sectional view showing the transistor substrate according to other embodiments of the present disclosure.

Since the transistor substrate according to other embodiments described with reference to FIG. 7 is substantially the same as the transistor substrate according to some embodiments described with reference to FIG. 1, except for adding the fourth transistor, descriptions for the substantially same or similar configurations will be omitted.

Referring to FIG. 7, the transistor substrate according to other embodiments may further include a fourth transistor TRd.

The fourth transistor TRd may be disposed in the second region 2A on the buffer layer 120. The fourth transistor TRd may be spaced apart from the second transistor TRb. The fourth transistor TRd may include a fourth oxide semiconductor layer 130d, a fourth gate electrode 150d, a fourth source electrode 173d, and a fourth drain electrode 175d.

In some embodiments, the fourth transistor TRd may be an n-channel transistor. However, the present disclosure is not limited thereto. In other embodiments, the fourth transistor TRd may be a p-channel transistor.

The fourth oxide semiconductor layer 130d may be disposed in the second region 2A on the second buffer layer 122. The fourth oxide semiconductor layer 130d may be spaced apart from the second oxide semiconductor layer 130b. The fourth oxide semiconductor layer 130d may include a fourth source region 133d, a fourth drain region 135d, and a fourth channel region 131d positioned therebetween.

The fourth oxide semiconductor layer 130d may include oxide of metal such as zinc (Zn), indium (In), gallium (Ga), tin (Sn), and titanium (Ti), or a combination of metal such as zinc (Zn), indium (In), gallium (Ga), tin (Sn), and titanium (Ti), and oxide thereof.

A length of the fourth channel region 131d may be longer than a length of the second channel region 131b. In some embodiments, the length of the second channel region 131b may be about 1.5 µm to about 4.0 µm, and the length of the fourth channel region 131d may be greater than or equal to about 4.0 µm. For example, the length of the second channel region 131b may be about 2.0 µm, and the length of the fourth channel region 131d may be about 4.0 µm.

Figure 8:
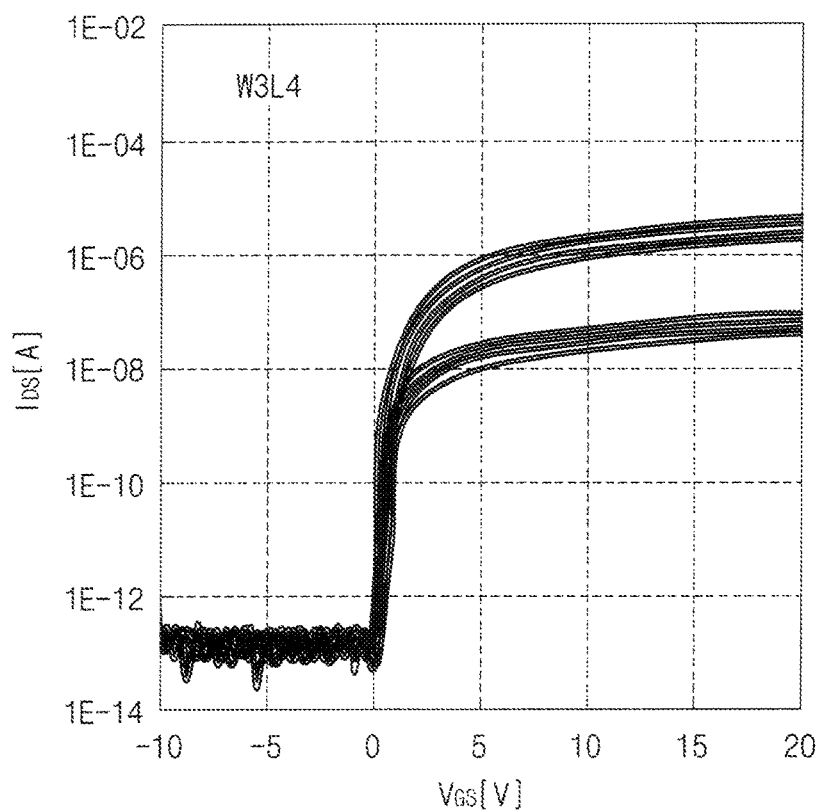
FIG. 8 is a graph showing a voltage-current relation of a fourth transistor of the transistor substrate in FIG. 7.

FIG. 8 is a graph showing a voltage-current relation of the fourth transistor TRd of the transistor substrate in FIG. 7.

Referring to FIGS. 3 and 8, the driving range of the fourth transistor TRd may be greater than the driving range of the second transistor TRb.

An s-factor of the fourth transistor TRd may be greater than an s-factor of the second transistor TRb. The "s-factor" refers to a voltage-current characteristic of a transistor, and denotes a gate voltage required to increase a drain current by 10 times when the gate voltage equal to or less than the threshold voltage is applied. The "s-factor" is generally referred to as the "sub-threshold slope". The s-factor may be inversely proportional to a slope of a curve (hereinafter, referred to as a 'V-I curve') representing a relationship between a gate-source voltage VGS and a drain-source current IDS of a transistor.

As shown in FIGS. 3 and 8, the slope of the V-I curve of the fourth transistor TRd may be smaller than the slope of the V-I curve of the second transistor TRb, and accordingly, the s-factor of the fourth transistor TRd may be greater than the s-factor of the second transistor TRb. In some embodiments, the s-factor of the se transistor TRb may be about 0.37, and the s-factor of the fourth transistor TRd may be about 0.45. Meanwhile, the s-factor may be proportional to the driving range of the transistor, and accordingly, the driving range of the fourth transistor TRd may be greater than the driving range of the second transistor TRb. In some embodiments, the driving range of the second transistor TRb may be about 3.15 V, and the driving range of the fourth transistor TRd may be about 4.67 V.

As described above, the length of the fourth channel region 131d may be longer than the length of the second channel region 131b, and the driving range of the transistor may be proportional to the length of the oxide semiconductor layer of the transistor. Accordingly, the driving range of the fourth transistor TRd may be greater than the driving range of the second transistor TRb.

A fourth gate insulating layer 140d may be disposed on the fourth oxide semiconductor layer 130d. The fourth gate insulating layer 140d may overlap the fourth channel region 131d. The fourth gate insulating layer 140d may include an insulating material such as silicon oxide (SiOx) and silicon nitride (SiNx). The fourth gate insulating layer 140d may be formed of the same material as the first gate insulating layer 140a and the second gate insulating layer 140b in the same manufacturing step. Since the fourth gate insulating layer 140d does not cover the fourth source region 133d and the fourth drain region 135d, the interlayer insulating layer 160 may come into direct contact with the fourth source region 133d and the fourth drain region 135d. Accordingly, since hydrogen diffuses from the interlayer insulating layer 160 adjacent to the fourth source region 133d and the fourth drain region 135d, the fourth source region 133d and the fourth drain region 135d may become conductive.

The fourth gate electrode 150d may be disposed on the fourth gate insulating layer 140d. The fourth gate electrode 150d may overlap the fourth oxide semiconductor layer 130d. Specifically, the fourth gate electrode 150d may overlap the fourth channel region 131d. The fourth gate electrode 150d may include at least one of copper (Cu), copper alloy, aluminum (Al), aluminum alloy, molybdenum (Mo), and molybdenum alloy. The fourth gate electrode 150d may be formed of the same material as the first gate electrode 150a and the second gate electrode 150b in the same manufacturing step.

A fourth source electrode 173d and a fourth drain electrode 175d connected to the fourth source region 133d and the fourth drain region 135d, respectively, may be disposed in the second region 2A on the interlayer insulating layer 160. The fourth source electrode 173d and the fourth drain electrode 175d may come into contact with the fourth source region 133d and the fourth drain region 135d through contact holes formed in the interlayer insulating layer 160, respectively. The fourth source electrode 173d and the fourth drain electrode 175d may include at least one of copper (Cu), copper alloy, aluminum (Al), aluminum alloy, molybdenum (Mo), and molybdenum alloy. The fourth source electrode 173d and the fourth drain electrode 175d may be formed of the same material as the first source electrode 173a, the first drain electrode 175a, the second source electrode 173b, and the second drain electrode 175b in the same manufacturing step.

Hereinafter, a display device according to some embodiments of the present disclosure will be described with reference to FIGS. 9 to 11.

The display device according to some embodiments may include the transistor substrate according to the above-described embodiments.

Figure 9:
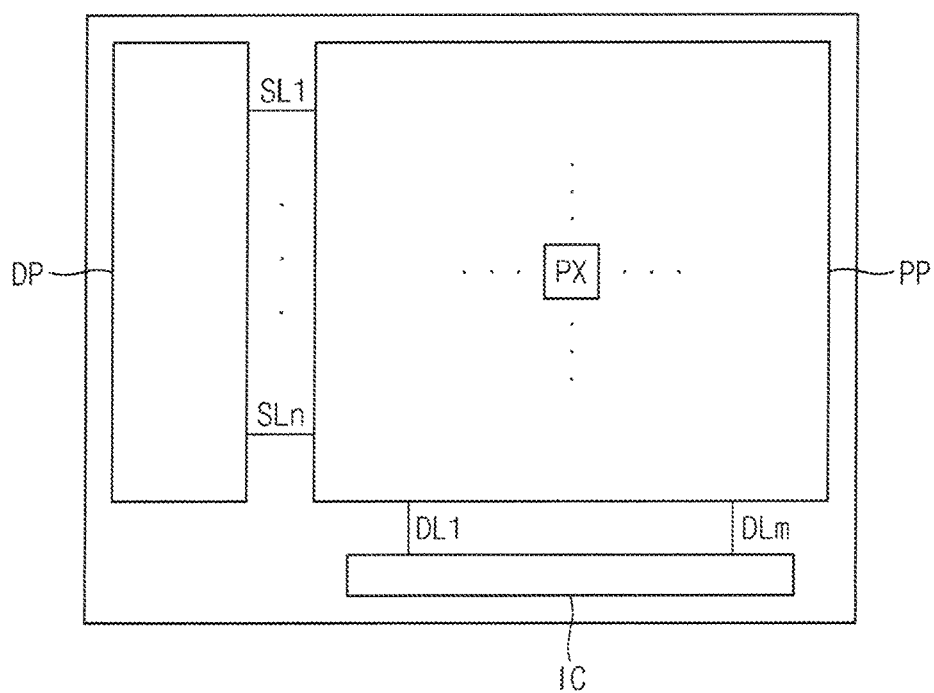
FIG. 9 is a plan view showing a display device according to some embodiments of the present disclosure.

FIG. 9 is a plan view showing the display device according to some embodiments of the present disclosure.

Referring to FIG. 9, the display device according to some embodiments, may include a pixel portion PP, a driving portion DP, and an integrated circuit mounting portion IC.

The pixel portion PP may include scan lines SL1 to SLn and data lines DL1 to DLm intersecting the scan lines SL1 to SLn. In addition, the pixel portion PP may include a plurality of pixel PX emitting light having colors different from each other.

The driving portion DP may be disposed at one side of the pixel portion PP. In some embodiments, the driving portion DP may be a scan driving portion. In this case, the driving portion DP may generate a scan signal in response to a scan control signal supplied from the outside, and sequentially supply the scan signals to the scan lines SL1 to SLn.

The integrated circuit mounting portion IC may be disposed at the other side of the pixel portion PP. In some embodiments, a data driving unit may be disposed in the integrated circuit mounting portion IC. The data driving portion may generate a data signal in response to data and a data control signal supplied from the outside, and supply the data signal to the data lines DL1 to DLm.

Figure 10:
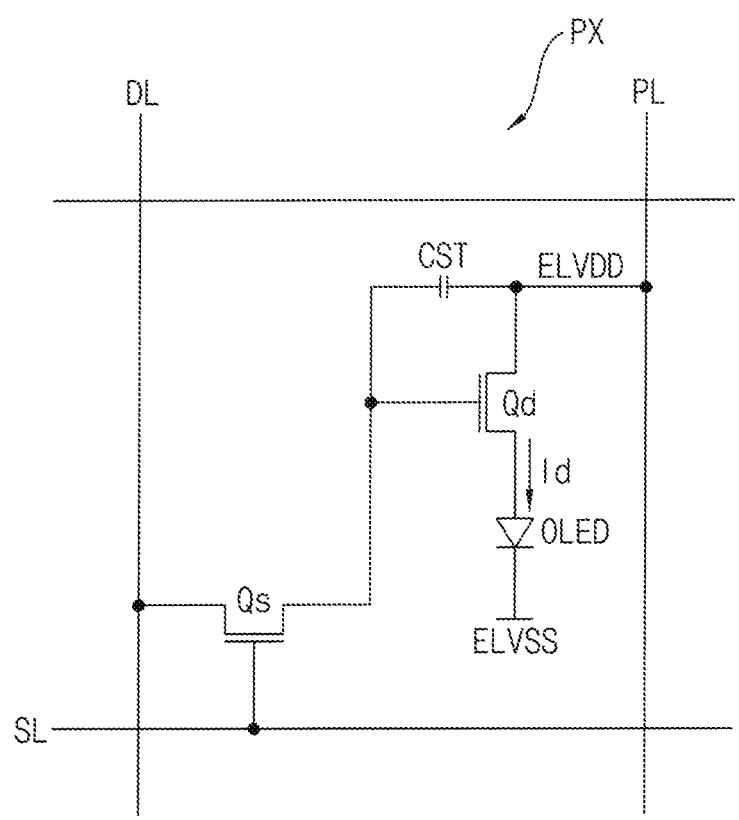
FIG. 10 is a circuit diagram showing one pixel PX in the display device of FIG. 9.

FIG. 10 is a circuit diagram showing one pixel PX in the display device of FIG. 9.

Referring to FIG. 10, the one pixel PX in the display device according to some embodiments may include signal lines SL, DL and PL, transistors Qs and Qd connected to the signal lines SL, DL and PL, a storage capacitor CST, and an organic light emitting diode OLED.

The signal lines SL, DL, and PL may include a scan line SL transmitting the scan signal, a data line DL transmitting the data signal, and a driving voltage line PL transmitting a driving voltage ELVDD.

The transistors Qd and Qs may include a switching transistor Qs and a driving transistor Qd.

The switching transistor Qs may have a control terminal, an input terminal, and an output terminal. The control terminal may be connected to the scan line SL, the input terminal may be connected to the data line DL, and the output terminal may be connected to the driving transistor Qd. The switching transistor Qs may respond to the scan signal applied to the scan line SL to transfer the data signal applied to the data line DL to the driving transistor Qd.

The driving transistor Qd may have a control terminal, an input terminal, and an output terminal. The control terminal may be connected to the switching transistor Qs, the input terminal may be connected to the driving voltage line PL, and the output terminal may be connected to the organic light emitting diode OLED. The driving transistor Qd may transmit a driving current Id, which has a size changed according to a voltage applied between the control terminal and the output terminal, to the organic light emitting diode OLED.

The storage capacitor CST may be connected between the control terminal and the input terminal of the driving transistor Qd. The storage capacitor CST may charge the data signal applied to the control terminal of the driving transistor Qd, and maintain the data signal even after the switching transistor Qs is turned off.

The organic light emitting diodes OLED may have an anode connected to the output terminal of the driving transistor Qd, and a cathode connected to a common voltage ELVSS. The organic light emitting diodes OLED may display an image by emitting light by changing the intensity according to the driving current Id.

Hereinafter, a detailed structure of the display device shown in FIGS. 9 and 10 will be described in detail with reference to FIG. 11.

Figure 11:
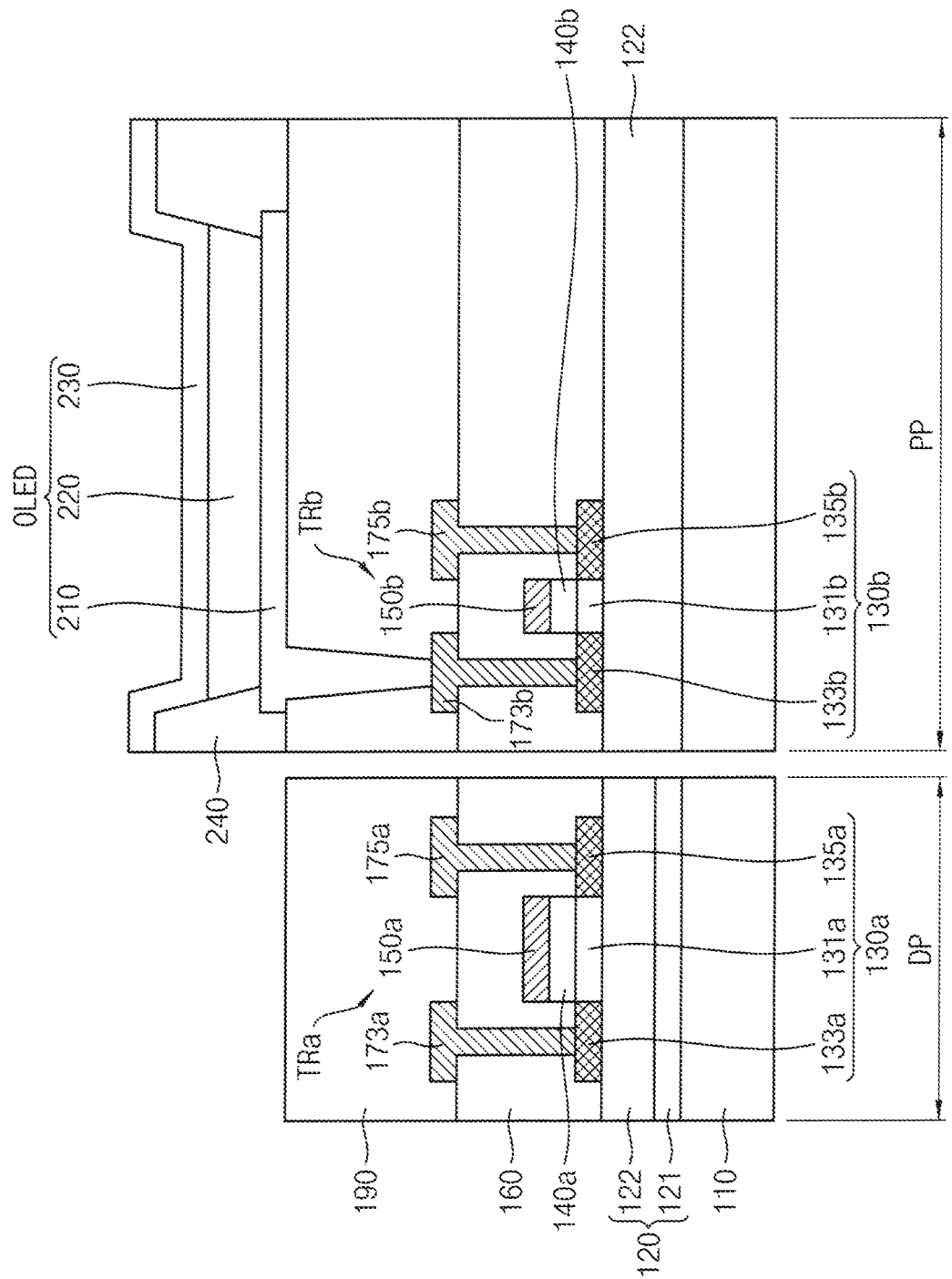
FIG. 11 is a sectional view showing a display device according to some embodiments of the present disclosure.

FIG. 11 is a sectional view showing the display device according to some embodiments of the present disclosure.

Referring to FIG. 11, the display device according to some embodiments may include a substrate 110 including a driving portion DP and a pixel portion PP, a buffer layer 120 disposed in the driving portion DP and the pixel portion PP on the substrate 110, a first transistor TRa disposed in the driving portion DP on the buffer layer 120, and a second transistor TRb disposed in the pixel portion PP on the buffer layer 120. The buffer layer 120 may include a first buffer layer 121 disposed in the driving portion DP on the substrate 110 and including silicon nitride SiNx, and a second buffer layer 122 disposed in the driving portion DP and the pixel portion PP on the first buffer layer 121 and including silicon oxide SiOx. The first transistor TRa may include a first oxide semiconductor layer 130$a$ and a first gate electrode 150$a$ overlapping the first oxide semiconductor layer 130$a$, and the second transistor TRb may include a second oxide semiconductor layer 130$b$ and a second gate electrode 150$b$ overlapping the second oxide semiconductor layer 130$b$.

The display device according to some embodiments may include the transistor substrate shown in FIG. 1. In this case, the driving portion DP and the pixel portion PP may correspond to the first region 1A and the second region 2A, respectively.

In some embodiments, the second transistor TRb may be a driving transistor Qd. However, the present disclosure is not limited thereto. In other embodiments, the second transistor TRb may be a switching transistor Qs.

A protective film 190 for covering the second transistor TRb may be disposed on the second transistor TRb. A first electrode 210 may be disposed on the protective film 190. The first electrode 210 may include a transparent conductive material such as indium tin oxide (ITO), indium zinc oxide (IZO), zinc oxide (ZnO), indium oxide (In2O3), or reflective metal such as lithium (Li), calcium (Ca), lithium fluoride/calcium (LiF/Ca), lithium fluoride/aluminum (LiF/Al), aluminum (Al), silver (Ag), magnesium (Mg), and gold (Au). The first electrode 210 may be connected to the second source electrode 173$b$ of the second transistor TRb to become the anode electrode of the organic light emitting diode OLED.

A pixel defining layer/pixel defining film 240 may be disposed on peripheries of the protective film 190 and the first electrode 210. The pixel defining film 240 may have an opening overlapping the first electrode 210. The pixel defining film 240 may include polyacrylic-based or polyimide-based resin, and silica-based inorganic materials.

A light emitting layer 220 may be disposed in the opening of the pixel defining film 240. The light emitting layer 220 may include an organic material. A second electrode 230 may be disposed on the pixel defining film 240 and the light emitting layer 220. The second electrode 230 may include a transparent conductive material such as indium tin oxide (ITO), indium zinc oxide (IZO), zinc oxide (ZnO), indium oxide (In2O3), or reflective metal such as lithium (Li), calcium (Ca), lithium fluoride/calcium (LiF/Ca), lithium fluoride/aluminum (LiF/Al), aluminum (Al), silver (Ag), magnesium (Mg), and gold (Au). The second electrode 230 may be the cathode electrode of the organic light emitting diode OLED. The first electrode 210, the light emitting layer 220, and the second electrode 230 may form the organic light emitting diode OLED.

In the display device according to some embodiments of the present disclosure, as the first buffer layer 121 including silicon nitride (SiNx) and the second buffer layer 122 including silicon oxide (SiOx) are disposed under the first transistor TRa, the first oxide semiconductor layer 130$a$ of the first transistor TRa may have a relatively greater charge mobility. Accordingly, the number of first transistors TRa disposed in the driving portion DP may decrease. In addition, as an area of the driving portion DP decreases, an area of a dead space of the display device may decrease.

In addition, in the display device according to some embodiments of the present disclosure, as only the second buffer layer 122 including silicon oxide (SiOx) is disposed under the second transistor TRb, the second oxide semiconductor layer 130b of the second transistor TRb may include a second channel region 131b having a relatively short length. Accordingly, an area of the second transistor TRb disposed in the pixel portion PP may decrease. In addition, as the number of second transistors TRb disposed in the pixel portion PP increases, the resolution of the display device may increase.

Figure 12:
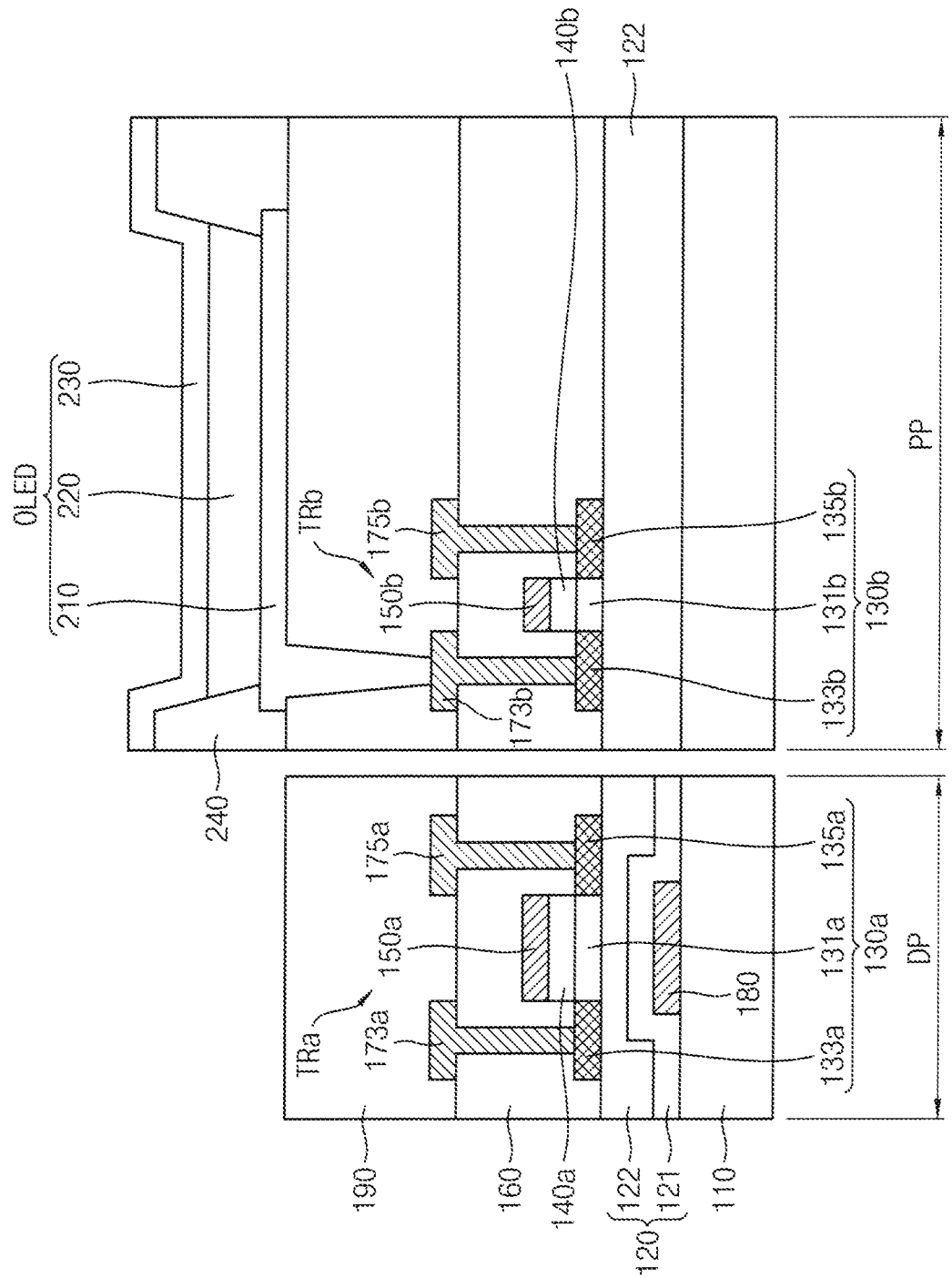
FIG. 12 is a sectional view showing a display device according to other embodiments of the present disclosure.

FIG. 12 is a sectional view showing the display device according to other embodiments of the present disclosure.

Since the display device according to other embodiments described with reference to FIG. 12 is substantially the same as the display device according to some embodiments described with reference to FIG. 11, except for the addition of the metal layer, descriptions for the substantially same or similar configurations will be omitted.

Referring to FIG. 12, the display device according to other embodiments may further include a metal layer 180 disposed between the substrate 110 and the first buffer layer 121, and overlapping the first oxide semiconductor layer 130a.

The display device according to some embodiments may include the transistor substrate shown in FIG. 4. However, the present disclosure is not limited thereto. The display device according to some embodiments may include the transistor substrate shown in FIG. 5.

Figure 13:
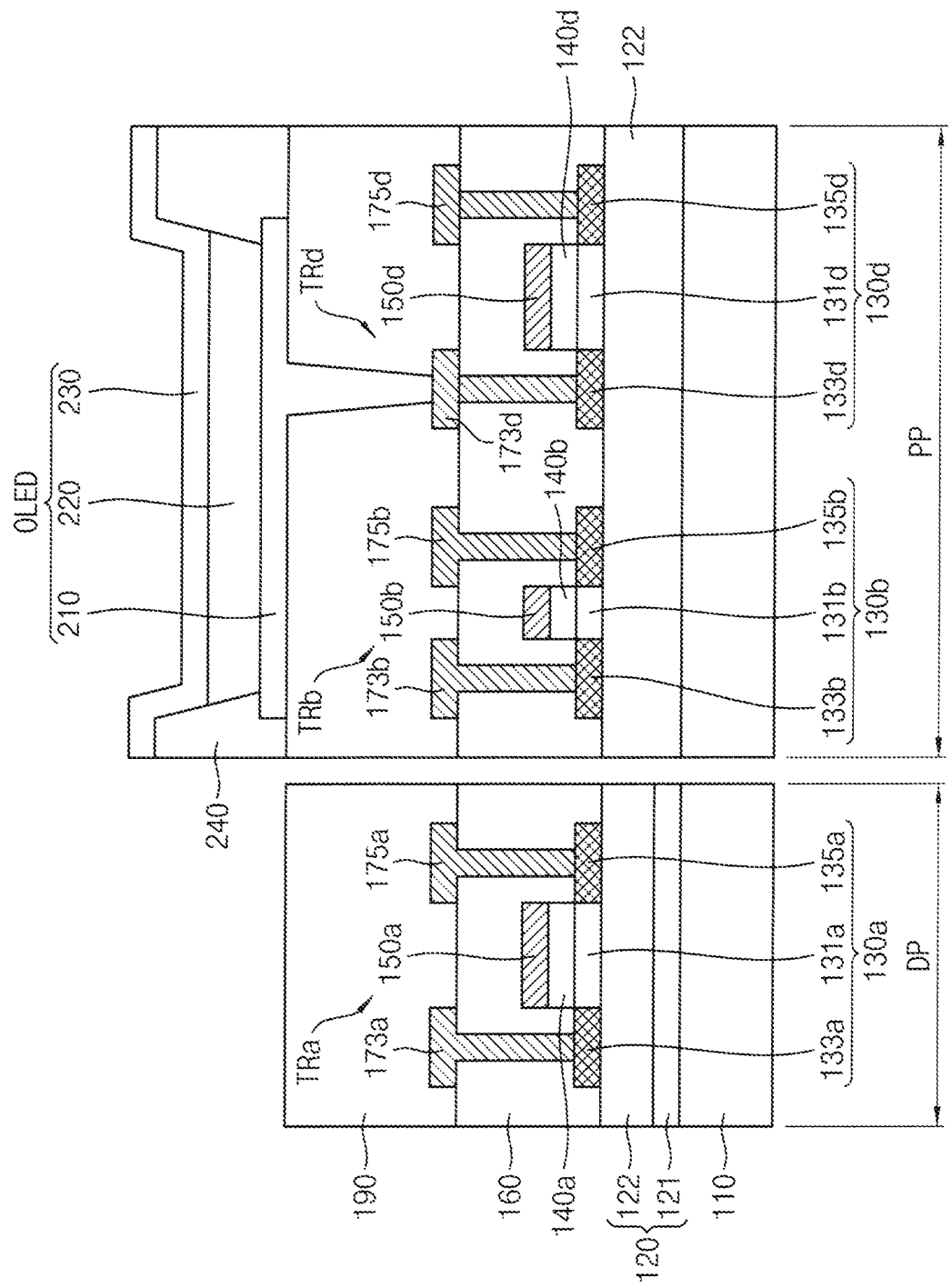
FIG. 13 is a sectional view showing a display device according to other embodiments of the present disclosure.

FIG. 13 is a sectional view showing the display device according to other embodiments of the present disclosure.

Since the display device according to other embodiments described with reference to FIG. 13 is substantially the same as the display device according to some embodiments described with reference to FIG. 11, except for adding the fourth transistor, descriptions for the substantially same or similar configurations will be omitted.

Referring to FIG. 13, the display device according to other embodiments may further include a fourth transistor TRd disposed in the pixel portion PP of the second buffer layer 122. The fourth transistor TRd may be spaced apart from the second transistor TRb. The fourth transistor TRd may include a fourth gate electrode 150d overlapping the fourth oxide semiconductor layer 130d.

The display device according to some embodiments may include the transistor substrate shown in FIG. 7. In some embodiments, the second transistor TRb may be a switching transistor Qs, and the fourth transistor TRd may be a driving transistor Qd. The first electrode 210 may be connected to the fourth source electrode 173d of the fourth transistor TRd to become the anode electrode of the organic light emitting diode OLED.

A length of the fourth channel region 131d of the fourth oxide semiconductor layer 130d may be longer than a length of the second channel region 131b of the second oxide semiconductor layer 130b. In some embodiments, the length of the second channel region 131b may be about 1.5 μm to about 4.0 μm, and the length of the fourth channel region 131d may be greater than or equal to about 4.0 μm. For example, the length of the second channel region 131b may be about 2.0 μm, and the length of the fourth channel region 131d may be about 4.0 μm.

The driving range of the transistor may be proportional to the length of the oxide semiconductor layer of the transistor. Accordingly, the driving range of the fourth transistor TRd may be greater than the driving range of the second transistor TRb. When the fourth transistor TRd as the driving transistor Qd has a relatively large driving range, the range of the intensity of the driving current Id transmitted to the organic light emitting diode OLED may be widened. Accordingly, the organic light emitting diode OLED may express more detailed gray scales.

INDUSTRIAL APPLICABILITY

The transistor substrate according to some embodiments of the present disclosure may be applied to a display device included in a computer, a notebook, a mobile phone, a smartphone, a smart pad, a PMP, a PDA, an MP3 player, or the like.

Although the transistor substrates and the display devices according to some embodiments of the present disclosure have been described with reference to the drawings, the illustrated embodiments are examples, and may be modified and changed by a person having ordinary knowledge in the relevant technical field without departing from the technical spirit of the present disclosure described in the following claims.

THE DESCRIPTION OF THE REFERENCE NUMERALS

110: substrate
120: buffer layer
121: first buffer layer
122: second buffer layer
130a: first oxide semiconductor layer
130b: second oxide semiconductor layer
150a: first gate electrode
150b: second gate electrode
210: first electrode
220: light emitting layer
230: second electrode
1A: first region
2A: second region
DP: driving portion
PP: pixel portion
TRa: first transistor
TRb: second transistor

The invention claimed is:
1. A transistor substrate comprising:
a substrate including a first region and a second region;
a first buffer layer on top of and contacting the substrate in the first region and including silicon nitride;
a second buffer layer on top of and contacting the first buffer layer in the first region and on top of and contacting the substrate in the second region, the second buffer layer including silicon oxide;
a first transistor in the first region on the second buffer layer and including a first oxide semiconductor layer and a first gate electrode overlapping the first oxide semiconductor layer; and
a second transistor in the second region on the second buffer layer and including a second oxide semiconductor layer and a second gate electrode overlapping the second oxide semiconductor layer.
2. The transistor substrate of claim 1, wherein the first oxide semiconductor layer includes a first source region, a first drain region, and a first channel region positioned therebetween, and wherein the second oxide semiconductor layer includes a second source region, a second drain region, and a second channel region positioned therebetween.

3. The transistor substrate of claim 2, wherein the second channel region has a length that is shorter than a length of the first channel region.

4. The transistor substrate of claim 2, wherein a length of the second channel region is about 1.5 μm to about 4.0 μm.

5. The transistor substrate of claim 2, further comprising an interlayer insulating layer on the first gate electrode and the second gate electrode,
wherein the first transistor further includes a first source electrode and a first drain electrode on the interlayer insulating layer and connected to the first source region and the first drain region, respectively, and
wherein the second transistor further includes a second source electrode and a second drain electrode on the interlayer insulating layer, and connected to the second source region and the second drain region, respectively.

6. The transistor substrate of claim 1, wherein the first oxide semiconductor layer has a charge mobility that is greater than a charge mobility of the second oxide semiconductor layer.

7. The transistor substrate of claim 1, further comprising:
a first gate insulating layer between the first oxide semiconductor layer and the first gate electrode; and
a second gate insulating layer between the second oxide semiconductor layer and the second gate electrode.

8. The transistor substrate of claim 1, wherein each of the first transistor and the second transistor includes an n-channel transistor.

9. The transistor substrate of claim 1, further comprising a metal layer between the substrate and the first buffer layer and overlapping the first oxide semiconductor layer.

10. The transistor substrate of claim 9, wherein the metal layer is connected to the first gate electrode.

11. The transistor substrate of claim 1, further comprising:
a third transistor in the first region on the second buffer layer, spaced apart from the first transistor, and including a third oxide semiconductor layer and a third gate electrode overlapping the third oxide semiconductor layer; and
a metal layer between the substrate and the first buffer layer and overlapping the third oxide semiconductor layer.

12. The transistor substrate of claim 11, wherein the third oxide semiconductor layer has a charge mobility that is greater than a charge mobility of the first oxide semiconductor layer.

13. The transistor substrate of claim 11, wherein the metal layer is connected to the third gate electrode.

14. The transistor substrate of claim 1, further comprising a third transistor in the second region on the second buffer layer, spaced apart from the second transistor, and including a third oxide semiconductor layer and a third gate electrode overlapping the third oxide semiconductor layer.

15. The transistor substrate of claim 14, wherein a length of a channel region of the third oxide semiconductor layer is longer than a length of a channel region of the second oxide semiconductor layer.

16. The transistor substrate of claim 14, wherein a length of a channel region of the third oxide semiconductor layer is about 4.0 μm or more.

17. The transistor substrate of claim 14, wherein a driving range of the third transistor is greater than a driving range of the second transistor.

18. A transistor substrate comprising:
a substrate including a first region and a second region;
a first buffer layer on top of and contacting the substrate in the first region;
a second buffer layer on top of and contacting the first buffer layer in the first region and on top of and contacting the substrate in the second region;
a first transistor in the first region on the second buffer layer and including a first oxide semiconductor layer and a first gate electrode overlapping the first oxide semiconductor layer; and
a second transistor in the second region on the second buffer layer and including a second oxide semiconductor layer and a second gate electrode overlapping the second oxide semiconductor layer,
wherein the first buffer layer in the first region has a hydrogen concentration that is higher than a hydrogen concentration of the second buffer layer in the second region.

19. The transistor substrate of claim 18, wherein the first buffer layer includes silicon nitride, and the second buffer layer includes silicon oxide.

20. A display device comprising:
a substrate including a driving portion and a pixel portion;
a first buffer layer in the driving portion on the substrate and including silicon nitride;
a second buffer layer in the driving portion on top of and contacting the first buffer layer, and in the pixel portion on top of and contacting the substrate, the second buffer layer including silicon oxide;
a first transistor in the driving portion on the second buffer layer and including a first oxide semiconductor layer and a first gate electrode overlapping the first oxide semiconductor layer;
a second transistor in the pixel portion on the second buffer layer and including a second oxide semiconductor layer and a second gate electrode overlapping the second oxide semiconductor layer;
a first electrode in the pixel portion on the substrate;
a second electrode facing the first electrode; and
a light emitting layer between the first electrode and the second electrode.

21. The display device of claim 20, further comprising a third transistor in the pixel portion on the second buffer layer, spaced apart from the second transistor, and including a third oxide semiconductor layer and a third gate electrode overlapping the third oxide semiconductor layer,
wherein a length of a channel region of the third oxide semiconductor layer is longer than a length of a channel region of the second oxide semiconductor layer.

22. The display device of claim 21, further comprising:
a scan line; and
a data line crossing the scan line,
wherein the second transistor is connected to the scan line and the data line, and the third transistor is connected to a display element.

23. The display device of claim 21, wherein the length of the channel region of the second oxide semiconductor layer is about 1.5 μm to about 4.0 μm, and wherein the length of the channel region of the third oxide semiconductor layer is about 4.0 μm or more.

* * * * *